(12) United States Patent
Masuda

(10) Patent No.: US 8,816,793 B2
(45) Date of Patent: Aug. 26, 2014

(54) TRANSMISSION LINE, IMPEDANCE TRANSFORMER, INTEGRATED CIRCUIT MOUNTED DEVICE, AND COMMUNICATION DEVICE MODULE

(75) Inventor: Satoshi Masuda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 684 days.

(21) Appl. No.: 13/018,565

(22) Filed: Feb. 1, 2011

(65) Prior Publication Data

US 2011/0204993 A1 Aug. 25, 2011

(30) Foreign Application Priority Data

Feb. 19, 2010 (JP) ................................ 2010-034772

(51) Int. Cl.
| | |
|---|---|
| H03H 7/38 | (2006.01) |
| H01P 5/02 | (2006.01) |
| H03F 1/56 | (2006.01) |
| H03F 3/195 | (2006.01) |
| H03F 3/24 | (2006.01) |
| H03F 3/60 | (2006.01) |

(52) U.S. Cl.
CPC *H01P 5/028* (2013.01); *H03H 7/38* (2013.01); *H03F 1/56* (2013.01); *H03F 3/195* (2013.01); *H03F 3/245* (2013.01); *H03F 3/602* (2013.01); *H03F 2200/222* (2013.01); *H03F 2200/255* (2013.01); *H03F 2200/387* (2013.01); *H03F 2200/423* (2013.01); *H01L 2224/49175* (2013.01)
USPC .......................................................... 333/33

(58) Field of Classification Search
USPC .............................................. 333/33, 32, 34
See application file for complete search history.

(56) References Cited

U.S. PATENT DOCUMENTS 5,973,567 A    10/1999   Heal et al.

FOREIGN PATENT DOCUMENTS

| EP | 0680141 A1 | 4/1995 |
|---|---|---|
| JP | 54-101648 A | 8/1979 |
| JP | 57-037903 | 3/1982 |
| JP | 59-190701 A | 10/1984 |
| JP | 61-82501 A | 4/1986 |
| JP | 63-99604 A | 4/1988 |
| JP | 2-98503 U | 8/1990 |
| JP | 3-66203 A | 3/1991 |
| JP | 8-186402 A | 7/1996 |
| JP | 10-284920 | 10/1998 |
| JP | 11-122009 | 4/1999 |
| JP | 2002-9510 A | 1/2002 |
| JP | 2010-11043 A | 1/2010 |

OTHER PUBLICATIONS

European Search Report mailed Aug. 22, 2011 for corresponding European Application No. EP 11 15 2090.
Partial European Search Report, mailed May 26, 2011 for corresponding European Application No. 11152090.4.

(Continued)

*Primary Examiner* — Stephen Jones
(74) *Attorney, Agent, or Firm* — Fujitsu Patent Center

(57) ABSTRACT

A transmission line having a plurality of branch lines that respectively include a first end part and a second end part and have a same line length, in which at least part of the plurality of branch lines includes bent shapes, the first end parts of the plurality of branch lines are connected to a common terminal, and the second end parts of the plurality of branch lines are connected to a common terminal. The plurality of branch lines may include two micro strip lines that are formed on substrates having the same dielectric constant and have bent shapes in symmetry with each other with respect to a straight line.

11 Claims, 17 Drawing Sheets

(56) References Cited

OTHER PUBLICATIONS

Cohn, Seymour B. "Optimum Design of Stepped Transmission-Line Transformers", IRE trans. MTT-3 1995, pp. 16-21.

Chinese Office Action mailed Apr. 24, 2013 for corresponding Chinese Application No. 201110043020.3, with English-language Translation.

Japanese Office Action mailed Oct. 29, 2013 for corresponding Japanese Application No. 2010-034772, with English-language Translation.

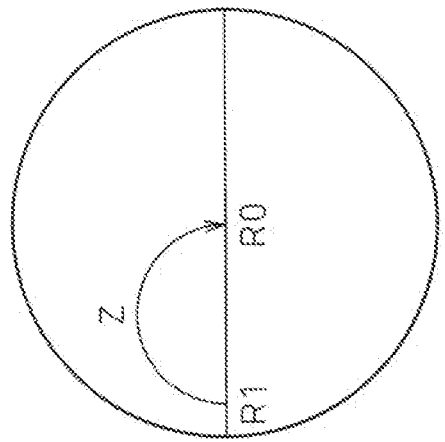
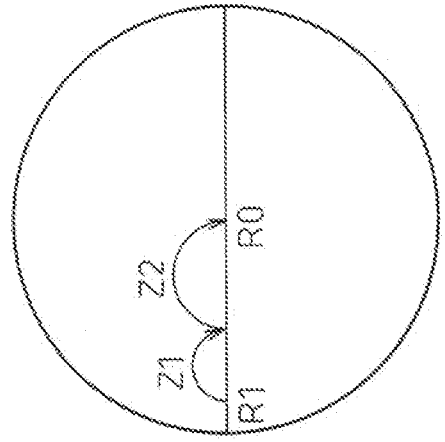
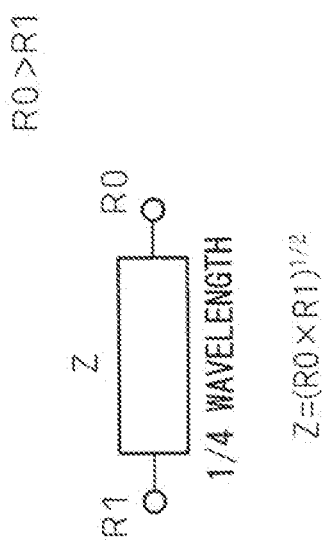
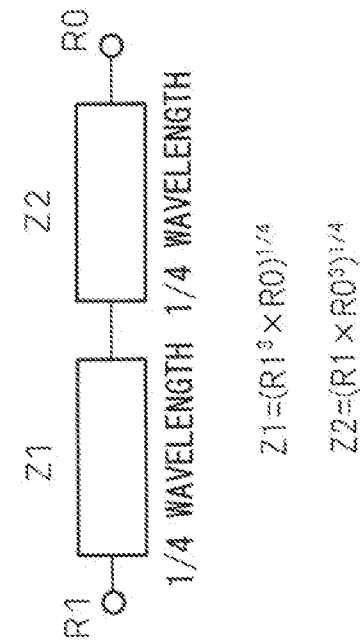
FIG. 1A "RELATED ART"
FIG. 1B "RELATED ART"

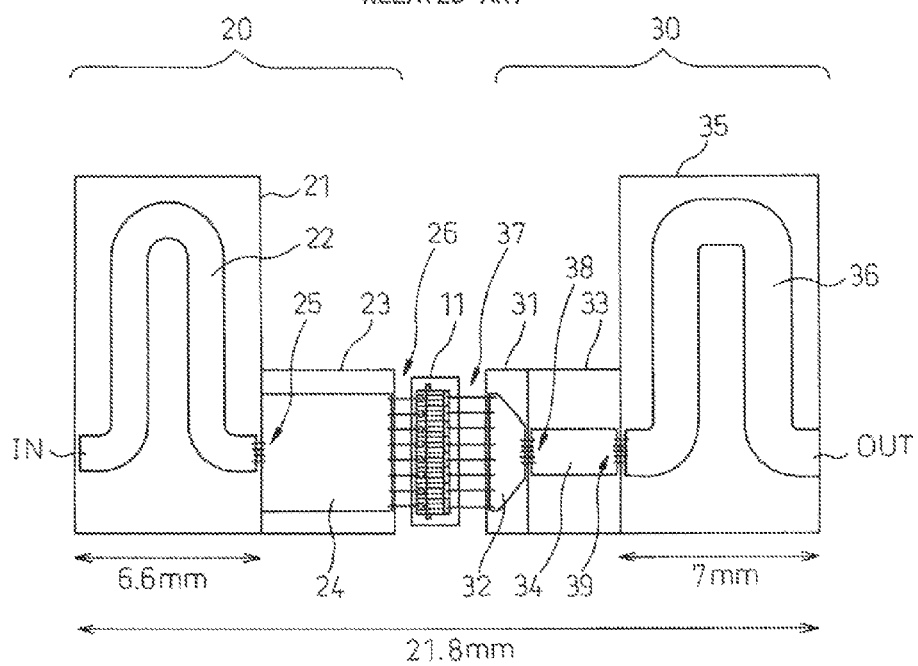

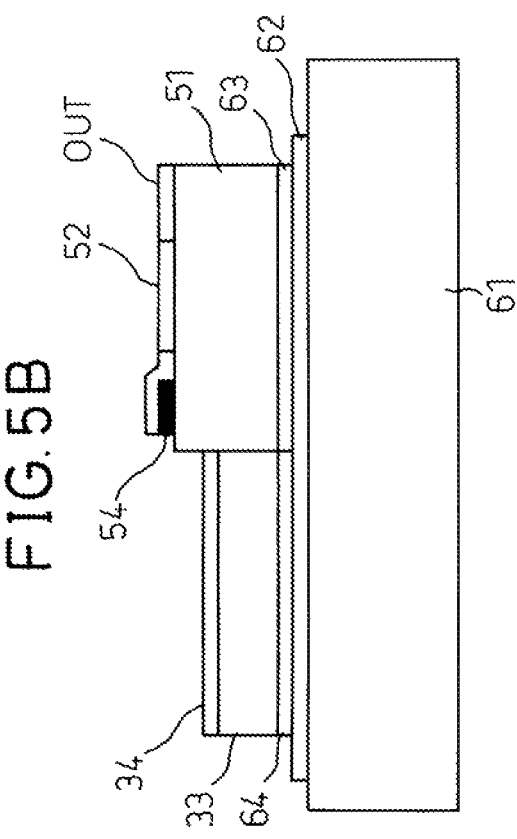
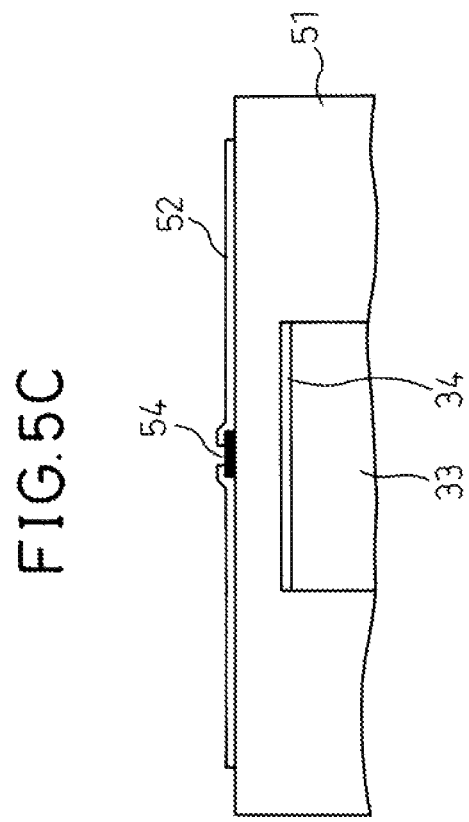
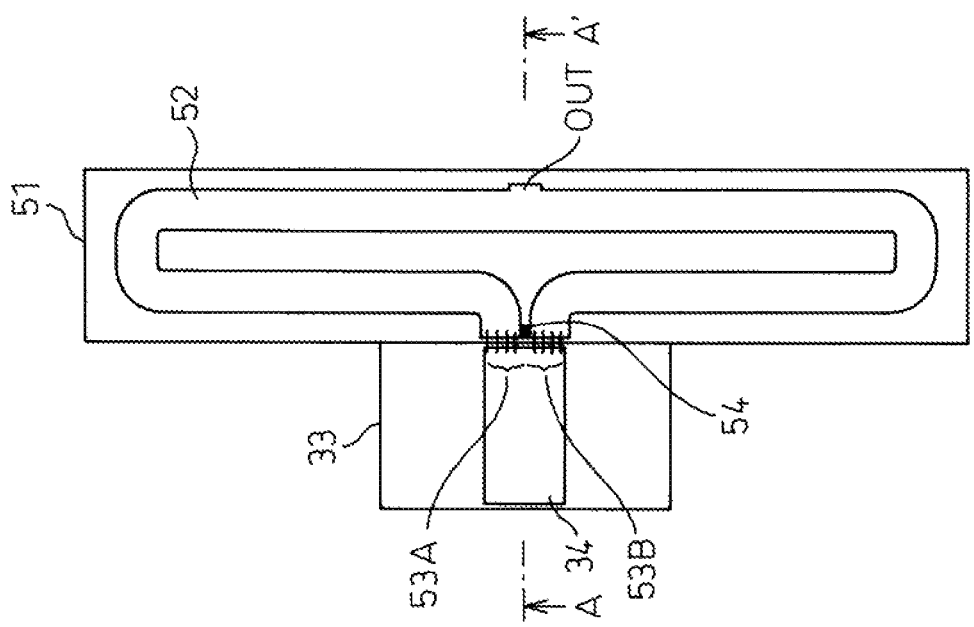

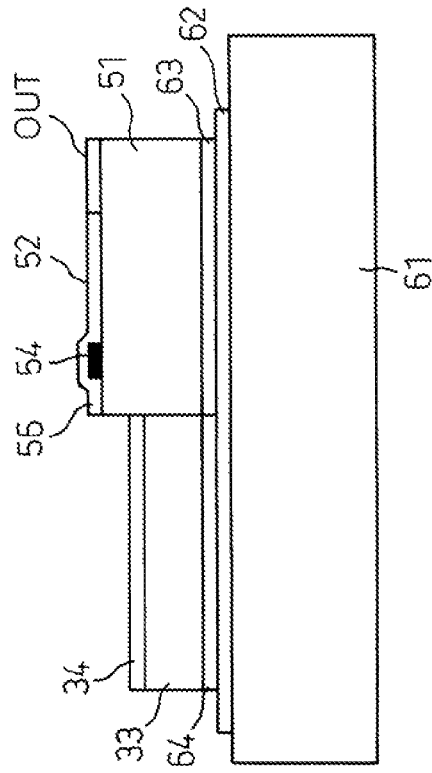
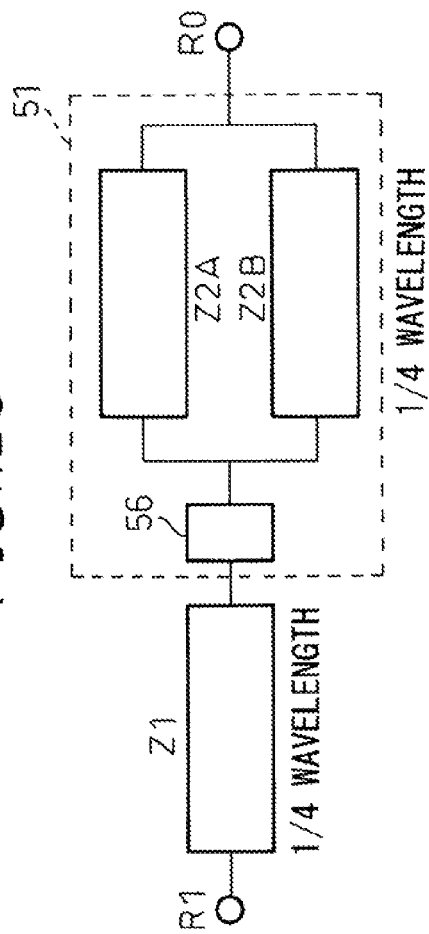
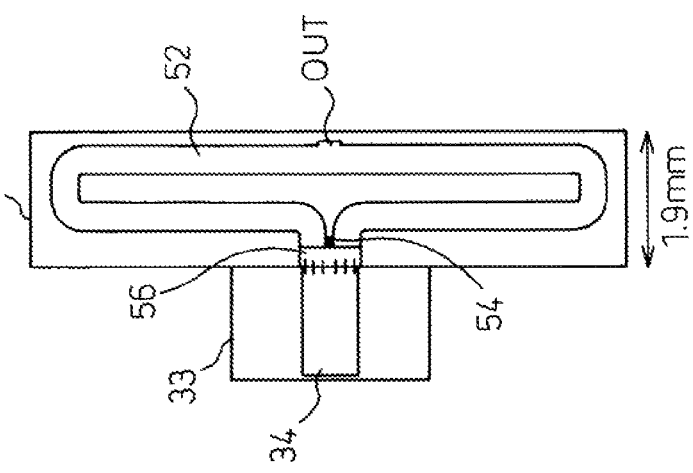

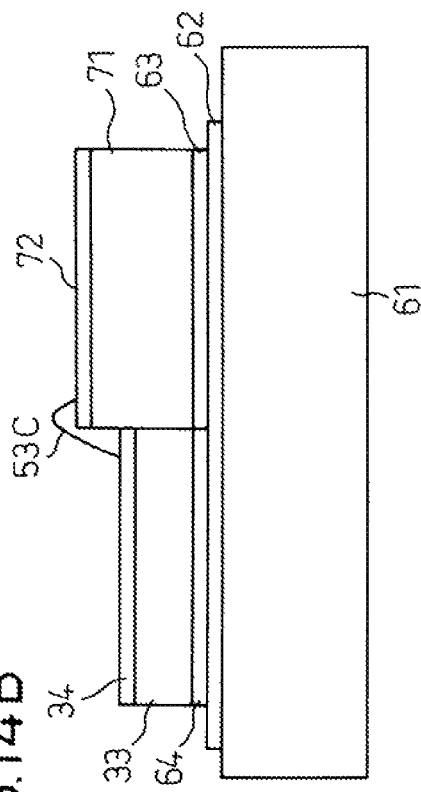
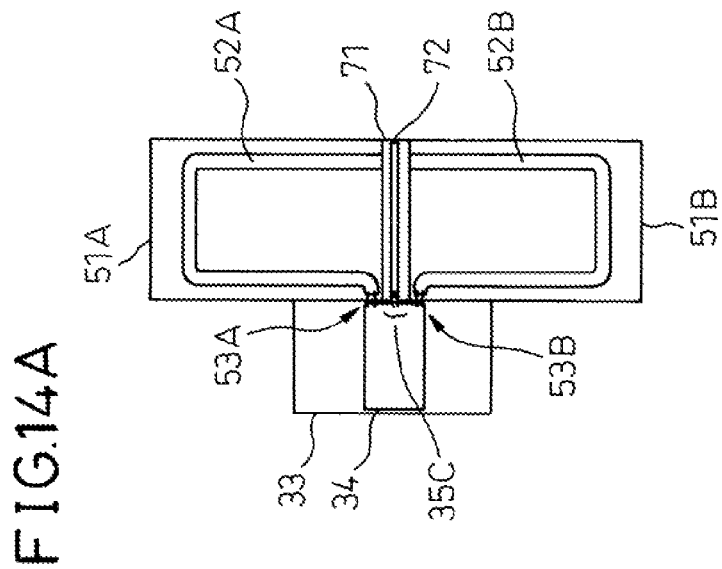
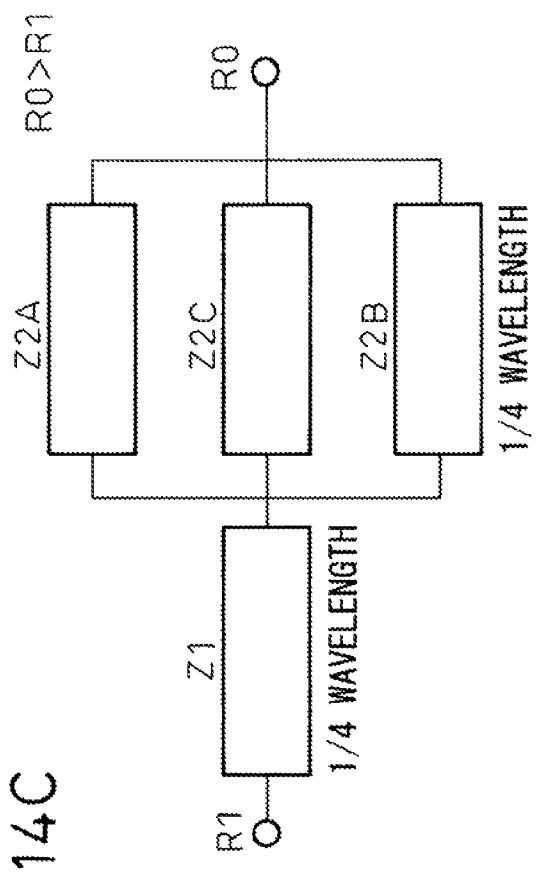

TRANSMISSION LINE, IMPEDANCE TRANSFORMER, INTEGRATED CIRCUIT MOUNTED DEVICE, AND COMMUNICATION DEVICE MODULE

CROSS-REFERENCE TO RELATED APPLICATIONS

This application is based upon and claims the benefit of priority of the prior Japanese Patent Application No. 2010-034772, filed on Feb. 19, 2010, the entire contents of which are incorporated herein by reference.

FIELD

The embodiments discussed herein are related to a transmission line, an impedance transformer including a transmission line, an integrated circuit mounted device including an impedance transformer, and a communication device module including an integrated circuit mounted device.

BACKGROUND

Recently, a high-output integrated circuit device that mounts an integrated circuit chip including a high-output transistor is demanded for a mobile telephone base station or radar. In such an integrated circuit mounted device, high-output characteristics are realized by arranging in parallel a plurality of power transistors formed on an integrated circuit chip on a metal package and forming an impedance transformer by a line on a dielectric substrate for impedance matching.

In order to form a wideband matching circuit, an impedance transformer is utilized, in which a plurality of ¼ wavelength lines is connected in series so as to keep a Q value small. Such an impedance transformer is used widely in an integrated circuit mounted device that requires wideband characteristics because the wideband characteristics may be obtained by increasing the number of stages of the ¼ wavelength line. When configuring a ¼ wavelength impedance transformer, a transmission line having a desired characteristic impedance is formed with the substrate thickness of the wire, the dielectric constant of the substrate, and the wire width being taken into consideration.

FIGS. 1A and 1B are diagrams explaining impedance conversion, wherein FIG. 1A illustrates a case of matching with one stage and FIG. 1B illustrates a case of matching with two stages. It is assumed that the output impedance of a transistor is R1, the input impedance in the subsequent stage is R0, and R0>R1 holds. When performing matching with one stage as illustrated in FIG. 1A, one ¼ wavelength line having a characteristic impedance Z is used and it is set as $Z=(R0 \times R1)^{1/2}$. In contrast to this, when performing matching with two stages as illustrated in FIG. 1B, a ¼ wavelength line having a characteristic impedance Z1 and a ¼ wavelength line having a characteristic impedance Z2 are connected in series and they are set as $Z1=(R1^3 \times R0)^{1/4}$ and $Z2=(R1 \times R0^3)^{1/4}$. There is a case where ¼ wavelength lines in three or more stages are connected in series.

In a high-output integrated circuit mounted device, the gate width of a transistor is increased in order to increase the output. The increase in the gate width of a transistor may be realized by using a plurality of transistors having the same characteristics in parallel and connecting the outputs of the plurality of transistors commonly. If the gate width of the transistor is increased in this manner, the output impedance of the transistor is reduced to 1Ω or less. In order to increase the output of the transistor at the maximum, the output impedance of several ohms is converted into 50Ω used normally and to perform impedance matching. In this case, in order to secure the frequency band, as illustrated in FIG. 1B, a plurality of impedance transformers are connected in series and the impedance is converted into 50Ω stepwise for matching. The shape of the ¼ wavelength line, such as its length and width, is determined based on the dielectric constant, the impedance, etc., of the substrate. Because of this, a high-impedance line that uses a substrate with a low dielectric constant has a longer length and a greater width compared to a low-impedance line that uses a substrate with a high dielectric constant. As a result, there is such a problem that the size of the matching circuit is increased. Because of this, a pattern layout in which a long line is bent in wiring is used to downsize the matching circuit.

FIG. 2 is a diagram illustrating a conventional example of a matching circuit of a high-output integrated circuit mounted device including a line in a bent shape. In FIG. 2, an integrated circuit chip 11 includes a plurality of transistors. The left side of the integrated circuit chip 11 is an input matching circuit 20 and the right side is an output matching circuit 30. The input matching circuit 20 includes a ¼ wavelength line 22 in a bent shape formed on a substrate 21, a ¼ wavelength line 24 in a linear shape formed on a substrate 23, a plurality of bonding wires 25 for connecting the ¼ wavelength line 22 and the ¼ wavelength line 24, and a plurality of bonding wires 26 for connecting the ¼ wavelength line 24 and the input terminal of the integrated circuit chip 11. An end part IN on the left side of the ¼ wavelength line 22 is an input part and connected to the terminal of the package of the integrated circuit mounted device with a wire bonding, etc. The output matching circuit 30 includes an electrode 32 in a tapered shape formed on a substrate 31, a ¼ wavelength line 34 in a linear shape formed on a substrate 33, a ¼ wavelength line 36 in a bent shape formed on a substrate 35, a plurality of bonding wires 37 for connecting the output terminal of the integrated circuit chip 11 and the electrode 32, a plurality of bonding wires 38 for connecting the electrode 32 and the ¼ wavelength line 34, and a plurality of bonding wires 39 for connecting the ¼ wavelength line 34 and the ¼ wavelength line 36. An end part OUT on the right side of the ¼ wavelength line 36 is an output part and connected to the terminal of the package of the integrated circuit mounted device with a wire bonding etc.

Normally, connection is realized by a plurality of bonding wires. For example, in the conventional example in FIG. 2, the integrated circuit chip 11 and the ¼ wavelength line 24, and the integrated circuit chip 11 and the ¼ wavelength line 32 are connected by the eight bonding wires 26 and 37, respectively. Further, for the connection of the ¼ wavelength line 22 and the ¼ wavelength line 24, the four bonding wires 25 are used and for the connection of the electrode 32 and the ¼ wavelength line 34 and the connection of the ¼ wavelength line 34 and the ¼ wavelength line 36, the five bonding wires 38 and 39 are used, respectively.

However, there is such a problem that the size of the matching circuit may not be reduced sufficiently even if the line in a bent shape as illustrated in FIG. 2 is used. The problem in particular relating to the size of the matching circuit is the distance from the left end to the right end in FIG. 2, i.e., the length in the direction of the signal path from the input terminal to the output terminal of the package. For example, in the conventional example in FIG. 2, the length of the ¼ wavelength line 22 in this direction is 6.6 mm, the length of the ¼ wavelength line 36 in this direction is 7 mm, and the total length is 21.8 mm.

For an integrated circuit, specifications of a general package size are determined and it is desirable to meet the specifications in practical use. Because of this, as illustrated in FIG. 2, the layout is made by using a pattern layout in which a long line is bent, however, there arises the problem that the line is not reduced in length sufficiently and it may not be accommodated in a package.

RELATED DOCUMENTS

[Patent Document 1] Japanese Laid-open Patent Publication No. H11-122009
[Patent Document 2] Japanese Laid-open Patent Publication No. H10-284920
[Patent Document 3] Japanese Laid-open Patent Publication No. S57-037903
[Non-Patent Document 1] S. B. Cohn, "Optimum Design of Stepped Transmission-Line Transformers", IRE trans. MTT-3, pp. 16-21, 1955.

SUMMARY

According to an aspect of the embodiments, a transmission line has a plurality of branch lines that respectively include a first end part and a second end part and have a substantially same line length, wherein at least part of the plurality of branch lines include bent shapes, the first end parts of the plurality of branch lines are connected to a common terminal, and the second end parts of the plurality of branch lines are connected to a common terminal.

The object and advantages of the embodiments will be realized and attained by means of the elements and combination particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIGS. 1A and 1B are diagrams explaining impedance conversion;
FIG. 2 is a diagram illustrating a conventional example of a matching circuit of a high-output integrated circuit mounted device including a line in a bent shape;
FIGS. 5A to 5C are diagrams illustrating a part of an output matching circuit in an integrated circuit mounted device in a second embodiment;
FIGS. 12A to 12C are diagrams illustrating a part of an output matching circuit in an integrated circuit mounted device in a fourth embodiment;
FIGS. 14A to 14C are diagrams illustrating a part of an output matching circuit in an integrated circuit mounted device in a fifth embodiment.

DESCRIPTION OF EMBODIMENTS

Embodiments are explained below with reference to the drawings.

Figure 3A:
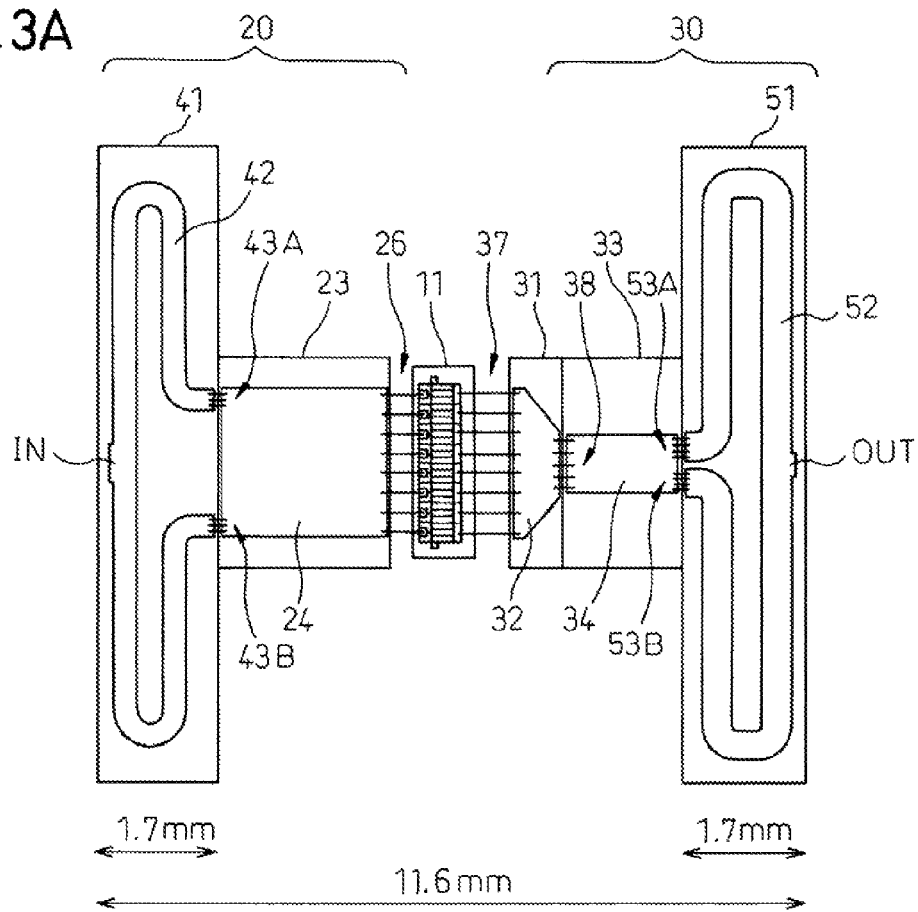
FIGS. 3A and 3B are diagrams illustrating a configuration of an integrated circuit mounted device in a first embodiment.
Figure 3B:
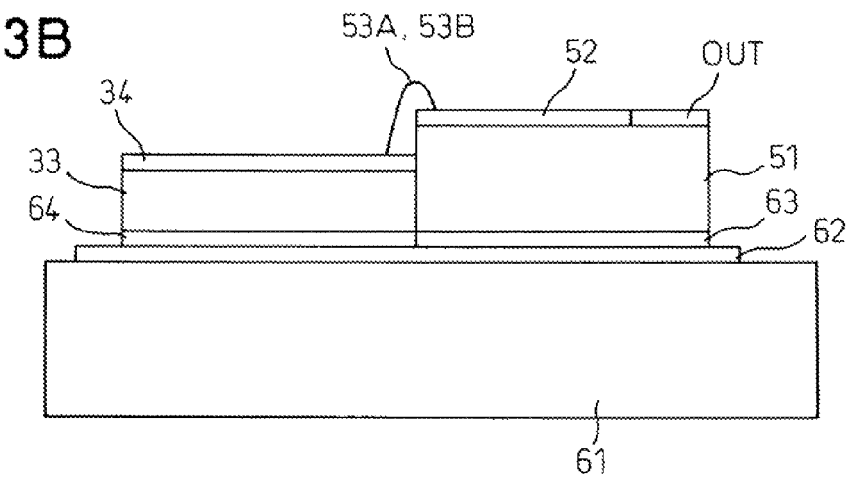

FIGS. 3A and 3B are diagrams illustrating a configuration of an integrated circuit mounted device in a first embodiment, wherein FIG. 3A is a top view and FIG. 3B is a section view along a center line of a part of an output matching circuit. The integrated circuit mounted device in the first embodiment amplifies a high-frequency signal of 2 to 4 GHz that is input to a signal having an output power of about 50 W and outputs it. In order to perform such amplification, a plurality of transistors having the same characteristics is used in parallel, the same signal is input to the plurality of transistors, and the outputs of the plurality of transistors are connected commonly, and thereby, the gate width of the transistor is increased substantially and thus the increase in output is realized.

As illustrated in FIG. 3A, the integrated circuit mounted device in the first embodiment includes an integrated circuit chip 11 including a plurality of transistors, an input matching circuit 20 arranged on one side (left side, here) of the integrated circuit chip 11, and an output matching circuit 30 arranged on the other side (right side, here) of the integrated circuit chip 11.

The input matching circuit 20 includes a ¼ wavelength line 42 in a bent shape formed on a substrate 41, a ¼ wavelength line in a linear shape formed on a substrate 23, two sets of bonding wires 43A and 43B for connecting the ¼ wavelength line 42 and the ¼ wavelength line 24, and a plurality of bonding wires 26 for connecting the ¼ wavelength line 24 and the input terminal of the integrated circuit chip 11. The center part of the left line of the ¼ wavelength line 22 is an input part IN and which is connected to the terminal of the package of the integrated circuit mounted device with a wire bonding etc. The bonding wire is a metal wire with a diameter of 25 μm. It is also possible to use ribbon bonding for connection instead of wire bonding.

The output matching circuit 30 includes an electrode 32 in a tapered shape formed on a substrate 31, a ¼ wavelength line 34 in a linear shape formed on a substrate 33, a ¼ wavelength line 52 in a bent shape formed on a substrate 51, a plurality of bonding wires 37 for connecting the output terminal of the integrated circuit chip 11 and the electrode 32, a plurality of bonding wires 38 for connecting the electrode 32 and the ¼ wavelength line 34, and two sets of bonding wires 53A and 53B for connecting the ¼ wavelength line 34 and the ¼ wavelength line 52. The center part of the right line of the ¼ wavelength line 52 is an output part OUT and which is connected to the terminal of the package of the integrated circuit mounted device with a wire bonding, etc.

As illustrated in FIG. 3A, the two sets of the bonding wires 43A and 43B include four wires, respectively, and the wire bonding 26 includes eight wires. The wire bonding 37 includes eight wires, the wire bonding 38 includes five wires, and the two sets of the bonding wires 53A and 53B include four wires, respectively.

As illustrated in FIG. 3A, the ¼ wavelength line 52 in a bent shape of the integrated circuit mounted device in the first embodiment includes two bent branch lines. One of the bent branch lines is connected to the ¼ wavelength line 34 in a linear shape and bends upward in FIG. 3A and the other bent branch line is connected to the ¼ wavelength line 34 in a linear shape and bends downward in FIG. 3A. The other sides of the two bent branch lines are connected to each other and integrated into one unit. The ¼ wavelength line 42 in a bent shape also includes two bent branch lines similarly.

At the part of the two bent branch lines of the ¼ wavelength line 52 in opposition to the ¼ wavelength line 34, the outer edges of the two bent branch lines are substantially in opposition to the outer edge of the ¼ wavelength line 34. At the part of the two bent branch lines of the ¼ wavelength line 42 in opposition to the ¼ wavelength line 24, the outer edges of the two bent branch lines are substantially in opposition to the outer edge of the ¼ wavelength line 24.

As illustrated in FIG. 3B, the substrates 33 and 51 are packaged on a metal base 61 of the package in a nitrogen atmosphere at 300° C. using AuSn solder 62. The material of the metal base 61 is CuW, Cu/Mo/Cu, Cu, etc., and the surface thereof is subjected to Ni/Au plating processing. The substrate 33 is made of a material having a relative dielectric constant of 140 and its thickness is 0.25 mm and its backside is subjected to plating 64. The ¼ wavelength line 34 formed on the surface of the substrate 33 is formed by a gold-plated wire of NiCr (0.2 μm)/Au (5 μm) and its wire width is 1.36 mm. The substrate 51 is made by alumina ceramics having a relative dielectric constant of 9.8 and its thickness is 0.38 mm and its backside is subjected to plating 63. The ¼ wavelength line 52 formed on the surface of the substrate 51 is formed by a gold-plated wire of Ti (0.2 μm)/Pd (0.1 μm)/Au (5 μm) and its wire width is 0.45 mm. The substrate 31 is also made of alumina ceramics having a relative dielectric constant of 9.8.

As described above, in the output matching circuit 30 in the first embodiment, the impedance transformer that converts, for example, 2Ω to 50Ω is formed by a transmission line having a desired characteristic impedance.

The substrate 23 and the line 24 formed thereon are made in the same manner as that of the substrate 33 and the ¼ wavelength line 34. The substrates 41, 31 and the lines 42, 32 formed thereon are made in the same manner as that of the substrate 51 and the ¼ wavelength line 52. These substrates and the integrated circuit chip 11 are packaged on the metal base 61 of the packaged by the same method as that described above.

Figure 4:
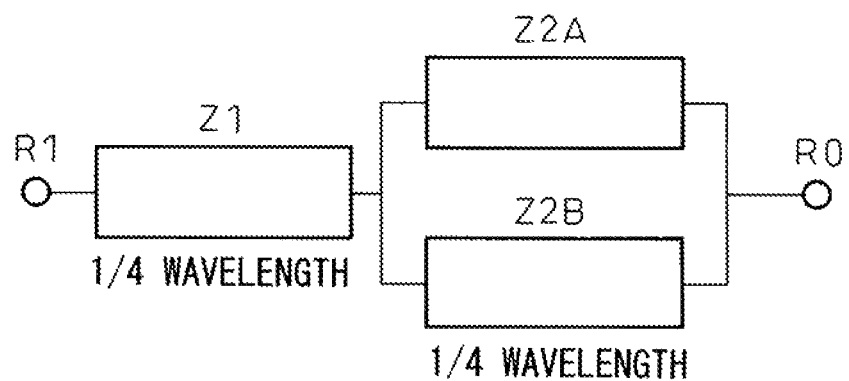
FIG. 4 is a diagram schematically illustrating an impedance conversion circuit of a part of a ¼ wavelength line and two bent branch lines in the first embodiment.

FIG. 4 is a diagram schematically illustrating the impedance conversion circuit of the part of the ¼ wavelength line 34 and the two bent branch lines of the ¼ wavelength line 52 in the first embodiment. A ¼ wavelength line Z1 corresponds to the ¼ wavelength line 34 and ¼ wavelength lines Z2A and Z2B correspond to the two bent branch lines of the ¼ wavelength line 52. In the impedance conversion circuit in FIG. 4, a ¼ wavelength line Z2 is formed by the two ¼ wavelength lines Z2A and Z2B in a circuit in which the two ¼ wavelength lines are connected in the two stages in FIG. 1B. Because of this, it is possible to make the characteristic impedances of the ¼ wavelength lines Z2A and Z2B twice the characteristic impedance of the ¼ wavelength line Z2 and in correspondence to this, it is possible to make the line widths of the ¼ wavelength lines Z2A and Z2B about half the line width of the ¼ wavelength line Z2. The two ¼ wavelength lines Z2A and Z2B have the same length and the shapes of the ¼ wavelength lines Z2A and Z2B are symmetric to each other with respect to a line as illustrated in FIG. 3A.

Because the line width may be nearly halved, the length in the transverse direction of the ¼ wavelength line 52 (substrate 51) may be set to 1.7 mm in the first embodiment in FIG. 3A while the length in the transverse direction (propagation direction of signal) of a ¼ wavelength line 36 (substrate 35) is 7 mm in FIG. 2. However, in the first embodiment, the two branch lines of the ¼ wavelength line 52 are bent in different directions, and therefore, the length in the longitudinal direction of the ¼ wavelength line 52 becomes longer than that in the conventional example in FIG. 2. However, when mounting the integrated circuit mounted device in the first embodiment on the package, there is a margin in the length in the longitudinal direction, and therefore, there is problem when mounting it on the package.

In the integrated circuit mounted device in the first embodiment, as illustrated in FIG. 3A, the ¼ wavelength line 42 in a bent shape of the input matching circuit 20 also includes two bent branch lines. Due to this, while the distance from the input part IN of the input matching circuit 20 to the output part OUT of the output matching circuit 30 is 21.8 mm in the conventional example in FIG. 2, it is 11.6 mm in the integrated circuit mounted device in the first embodiment in FIG. 3A.

Further, in the integrated circuit mounted device in the first embodiment, the input matching circuit 20 and the output matching circuit 30 are impedance-matched, and therefore have low loss.

FIGS. 5A to 5C are diagrams illustrating the part of the ¼ wavelength line 34 and the two bent branch lines of the ¼ wavelength line 52 in an integrated circuit mounted device in a second embodiment, wherein FIG. 5A is a top view, FIG. 5B is an A-A' section view, and FIG. 5C is a left side view.

The integrated circuit mounted device in the second embodiment differs from that in the first embodiment in that a resistor 54 that connects the two bent branch lines is provided in the vicinity of the part of the two bent branch lines of the ¼ wavelength line 52 in opposition to the ¼ wavelength line 34 and others are the same as illustrated in FIG. 5A.

The resistor 54 is a TaN film formed in the vicinity of the part of the substrate 51 in opposition to the ¼ wavelength line 34. As illustrated in FIGS. 5B and 5C, after forming the resistor 54 on the substrate 51, the two bent branch lines of the ¼ wavelength line 52 are formed so that their part covers the resistor 54.

Figure 6:
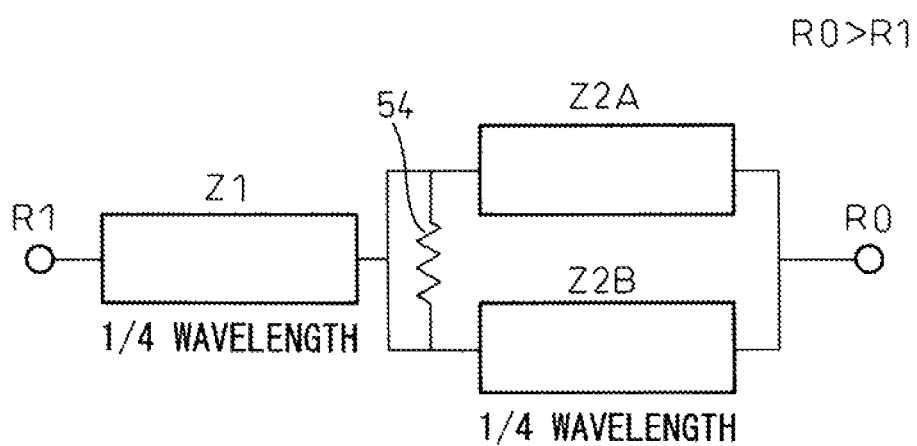
FIG. 6 is a diagram schematically illustrating an impedance conversion circuit of a part of a ¼ wavelength line and two bent branch lines in the second embodiment.

FIG. 6 is a diagram schematically illustrating the impedance conversion circuit of the part of the ¼ wavelength line 34 and the two bent branch lines of the ¼ wavelength line 52 in the second embodiment. The resistor 54 is provided so as to connect the two bent branch lines.

The resistor 54 acts to resolve imbalance when the operation (signal) of the two bent branch lines become imbalanced.

Figure 7:
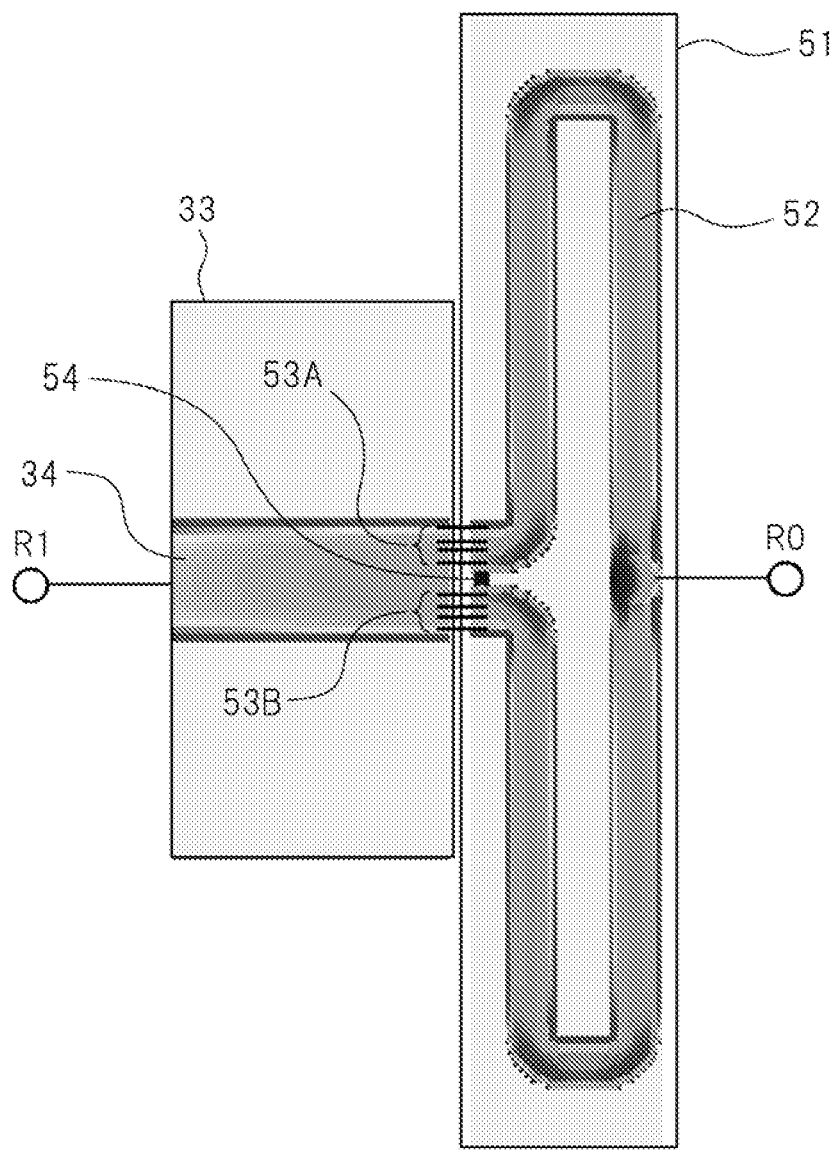
FIG. 7 is a diagram illustrating a ¼ wavelength line and a result of an electromagnetic field simulation of an in-plane distribution of a high-frequency current that flows through the ¼ wavelength line.

FIG. 7 illustrates a result of an electromagnetic field simulation of the in-plane distribution of a high-frequency current that flows through the ¼ wavelength line 34 and the ¼ wavelength line 52. The simulation is carried out using the substrate data that is used practically. That is, the substrate 33 is set so as to have a substrate thickness of 0.25 mm, a relative dielectric constant of 140, a line width of 1.36 mm, and an Au wire thickness of 5 μm, and the substrate 51 is set to have a substrate thickness of 0.38 mm, a relative dielectric constant of 9.8, a line width of 0.45 mm, and an Au wire thickness of 5 μm.

As illustrated in FIG. 7, it may be seen that the high-frequency current that flows through the transmission line 34 of the substrate 33 concentrates on the substrate side surface (the dark part means a high current region). As to the substrate 51, it may also be seen that a large current flows through the side surface of the transmission line 52. In particular, it may be seen that the electric current concentrates on the side surface outside the wire in the vicinity of the connection part of the line 34 and the line 52. Consequently, in order to efficiently transmit the electric current that flows through the transmission line 34 of the substrate 33 to the transmission line 52 of the substrate 51, it may be seen effective to align the line side surface of the transmission line 34 with the outer side surface of the transmission line 52 in the same position and to connect both with a wire at the part. Because of this, as described above, in the first embodiment, arrangement is made so that the outer edges of the two bent branch lines of the ¼ wavelength line 52 are substantially in opposition to the outer edge of the ¼ wavelength line 34. Further, arrangement is made so that at the part of the two bent branch lines of the ¼ wavelength line 42 in opposition to the ¼ wavelength line 24, the outer edges of the two bent branch lines are substantially in opposition to the outer edge of the ¼ wavelength line 24.

Further, in the first embodiment, the two sets of the bonding wires 53A and 53B connect the ¼ wavelength line 34 and the two bent branch lines of the ¼ wavelength line 52, respectively. The two sets of the bonding wires 53A and 53B include four wires, respectively, however, one of the wires of the respective sets is arranged so that one end is located in the vicinity of the outer edge of the ¼ wavelength line 34 and the other end in the vicinity of the edges of the two bent branch lines. This arrangement of the bonding wires is the same as that of other bonding wires and further, the same in the second embodiment also.

As illustrated in FIG. 7, in the transmission of the high-frequency signal, the electric current that flows through the wire tends to flow along the surface of the wire due to the skin effect. In particular, in the case of a micro strip line of a planar line, the electric current flows intensively through the side surface part of the wire. Consequently, electrical discontinuity occurs at the connection part of wires on different substrates and the transmission loss increases. Further, in high frequencies, the wire width becomes narrower apparently, causing an increase in a loss. Because of this, as in the conventional example illustrated in FIG. 2, when a wire bonding is arranged in a position distant from the edge of the line or the line widths of the ¼ wavelength lines 22 and 24 become greater, it results in a factor to impede an increase in output power.

In contrast to this, in the first and second embodiments, the side surface of one transmission line and the outer side surfaces of two transmission lines are arranged in positions close to each other and the bonding wires are arranged in the vicinity of the edge. Due to this, it is possible to efficiently transmit a high-frequency current that flows through the line on one of the substrates to the line on the other substrate.

Figure 8:
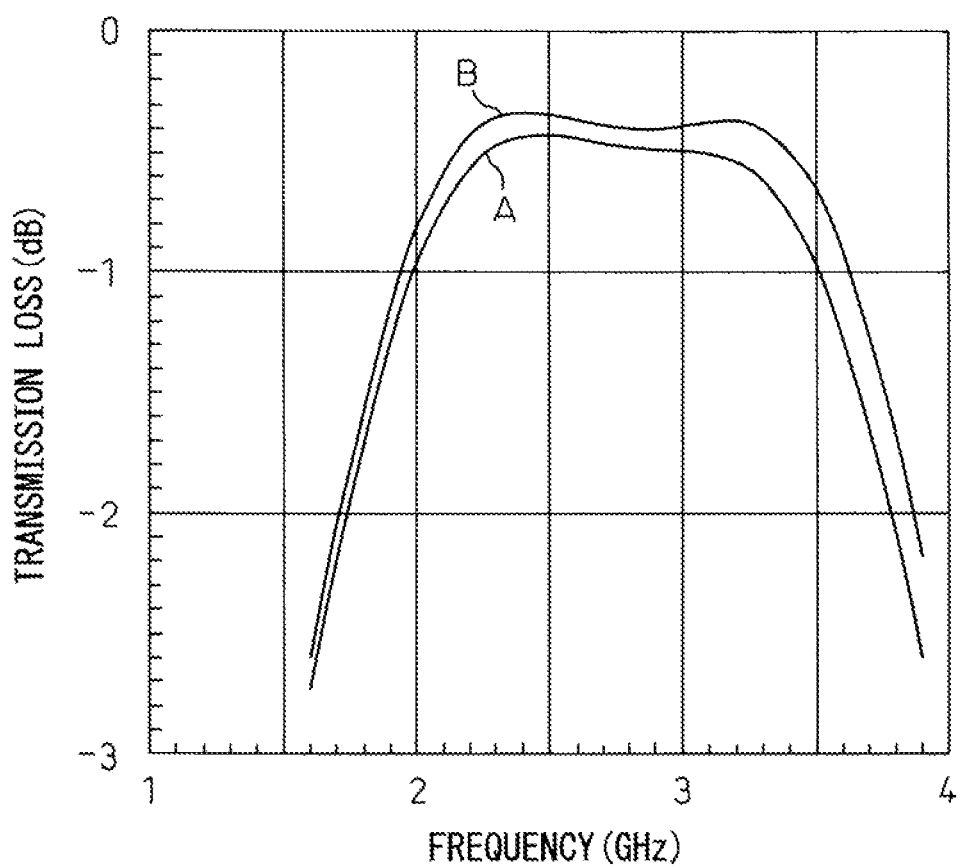
FIG. 8 is a graph of a calculation result of a calculation of the transmission loss in the conventional example in FIG. 2 and in the output matching circuit in the second embodiment by a simulation using an electromagnetic field analysis.

FIG. 8 illustrates a calculation result when the transmission loss in the output matching circuit 30 in conventional example in FIG. 2 and in the second embodiment is calculated by a simulation using an electromagnetic field analysis, wherein A illustrates the result of the conventional example and B illustrates the result of the second embodiment. From the comparison between the results, it may be seen that the loss is reduced 0.1 to 0.3 dB in the frequency range of 2 to 3.5 GHz. This will contribute to the increase in output power and efficiency and the above-mentioned effect may be confirmed quantitatively.

Figure 9A:
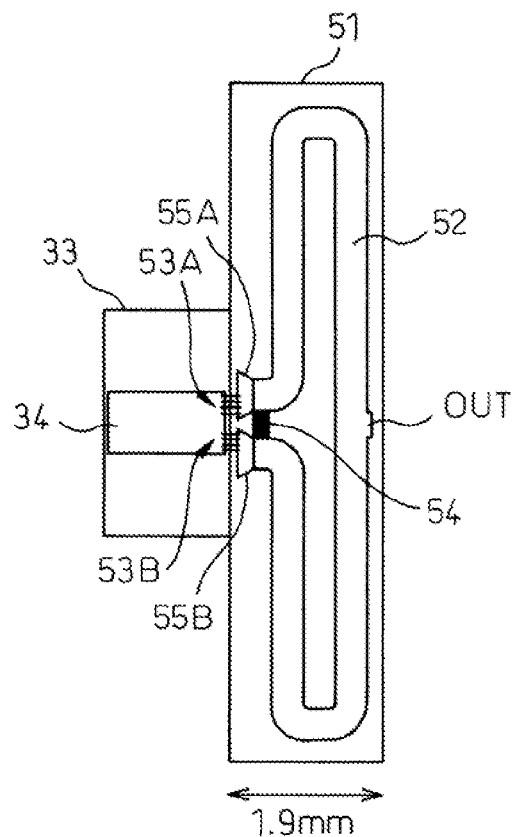
FIGS. 9A to 9C are diagram illustrating a part of an output matching circuit in an integrated circuit mounted device in a third embodiment.
Figure 9B:
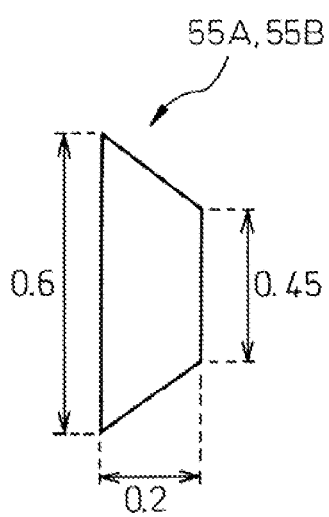
Figure 9C:
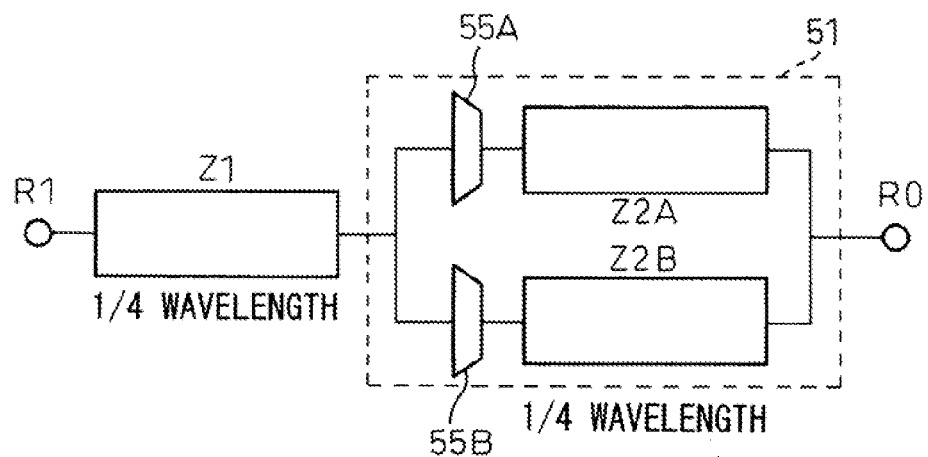

FIGS. 9A to 9C are diagrams illustrating the part of the ¼ wavelength line 34 and the two bent branch lines of the ¼ wavelength line 52 in an integrated circuit mounted device in a third embodiment, wherein FIG. 9A is a top view and FIG. 9B is a diagram illustrating the shape of the tip end parts of the two bent branch lines. FIG. 9C is a diagram schematically illustrating an impedance conversion circuit of the part of the ¼ wavelength line 34 and the two bent branch lines of the ¼ wavelength line 52 in the third embodiment.

The integrated circuit mounted device in the third embodiment differs from that in the second embodiment in that tapered electrode parts 55A and 55B are provided respectively at the tip ends of the two bent branch lines of the ¼ wavelength line 52 in opposition to the ¼ wavelength line 34 and others are the same. In other words, in the third embodiment, the tip ends of the two bent branch lines of the ¼ wavelength line 52 are tapered. In order to provide the tapered electrodes at the tip ends of the two bent branch lines, the width of the substrate 51 is increased from 1.7 mm to 1.9 mm. Arrangement is made so that the center of the tapered tip end agrees with the side surface of the ¼ wavelength line 34. Due to this, it is possible to efficiently transmit a higher-frequency current.

Figure 10:
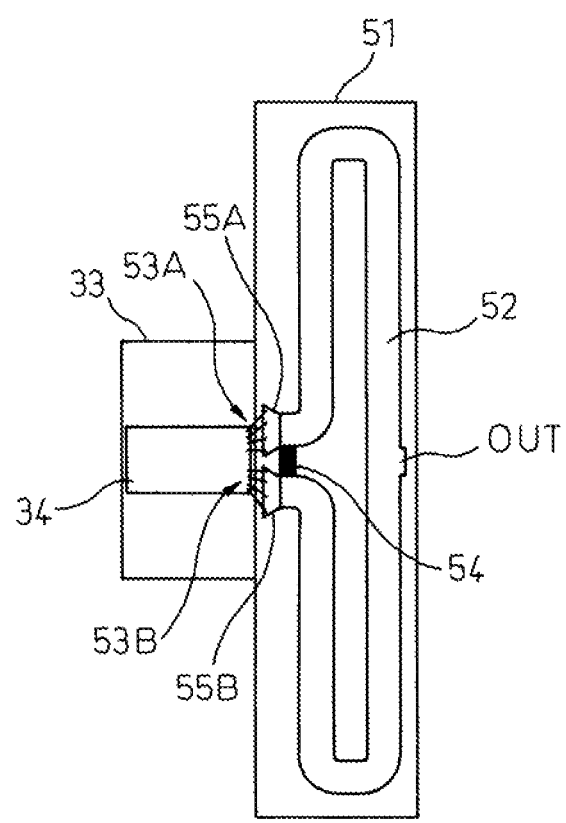
FIG. 10 is a diagram illustrating a modified example of the arrangement of wires when a ¼ wavelength line and two tip ends of a bent branch line are connected by four metal wires, respectively, in the third embodiment.

As illustrated in FIG. 9B, in the tapered shape of the tip ends of the two bent branch lines, the width of the tip end is set to 0.6 mm and the length to 0.2 mm. Then, the ¼ wavelength line 34 and the two tip ends of the bent branch lines are connected by the four metal wires 53A and 53B, respectively. In the arrangement of the wire, it is possible to arrange the wires in parallel with the direction of wiring (transverse direction) as illustrated in FIG. 9A or to connect the wires in a radial shape so as to agree with the width of the tapered line as illustrated in FIG. 10.

Figure 11:
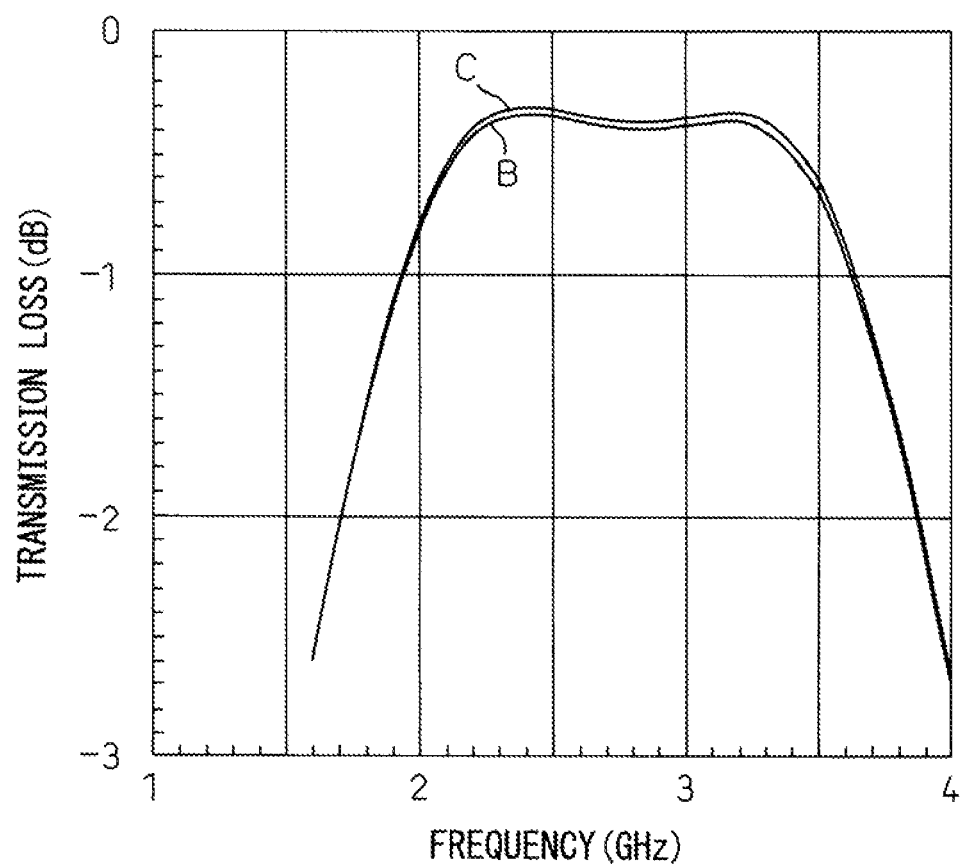
FIG. 11 is a graph of a calculation result of a calculation of the transmission loss in the output matching circuit in the third embodiment by a simulation.

FIG. 11 illustrates a calculation result C by calculating the transmission loss in the output matching circuit 30 in the third embodiment in the arrangement of the wire bonding in FIG. 9A by a simulation and also illustrates the result in the second embodiment as B for information. From this result, it is possible to confirm that the loss may be reduced about 0.03 dB in the frequency range of 2.5 to 3.5 GHz by providing a tapered line.

FIGS. 12A to 12C are diagrams illustrating the part of the ¼ wavelength line 34 and the two bent branch lines of the ¼ wavelength line 52 in an integrated circuit mounted device in a fourth embodiment, wherein FIG. 12A is a top view and FIG. 12B is a section view along the center line. FIG. 12C is a diagram schematically illustrating an impedance conversion circuit at the part of the ¼ wavelength line 34 and the two bent branch lines of the ¼ wavelength line 52 in the fourth embodiment.

The integrated circuit mounted device in the fourth embodiment differs from that in the second embodiment in that the tip ends of the two bent branch lines of the ¼ wavelength line 52 is provided with an electrode 56 and others are the same. The width of the electrode 56 is 1.36 mm, the same as that of the ¼ wavelength line 34 and the length is 0.2 mm. As illustrated in FIG. 12B, it is possible to simultaneously form the electrode 56 in the same process as that in which the two bent branch lines of the ¼ wavelength line 52 are formed. In other words, in the fourth embodiment, the tip ends of the two bent branch lines of the ¼ wavelength line 52 are connected and integrated into one unit and the two bent branch lines branch from the electrode 56. The two sets of the bonding wires 53A and 53B connect the ¼ wavelength line 34 on the substrate 33 and the electrode 56, respectively.

In the fourth embodiment, the ¼ wavelength line 34 and the electrode 56 may be connected smoothly and it is possible to efficiently transmit the high-frequency current that flows through the ¼ wavelength line 34 to the electrode 56. Further, it branches into the two bent branch lines of the ¼ wavelength line 52 on the same substrate, and therefore, it is possible to transmit the high-frequency current more efficiently. As a result, a matching circuit with a low loss may be configured and a higher-output semiconductor circuit may be realized.

Figure 13:
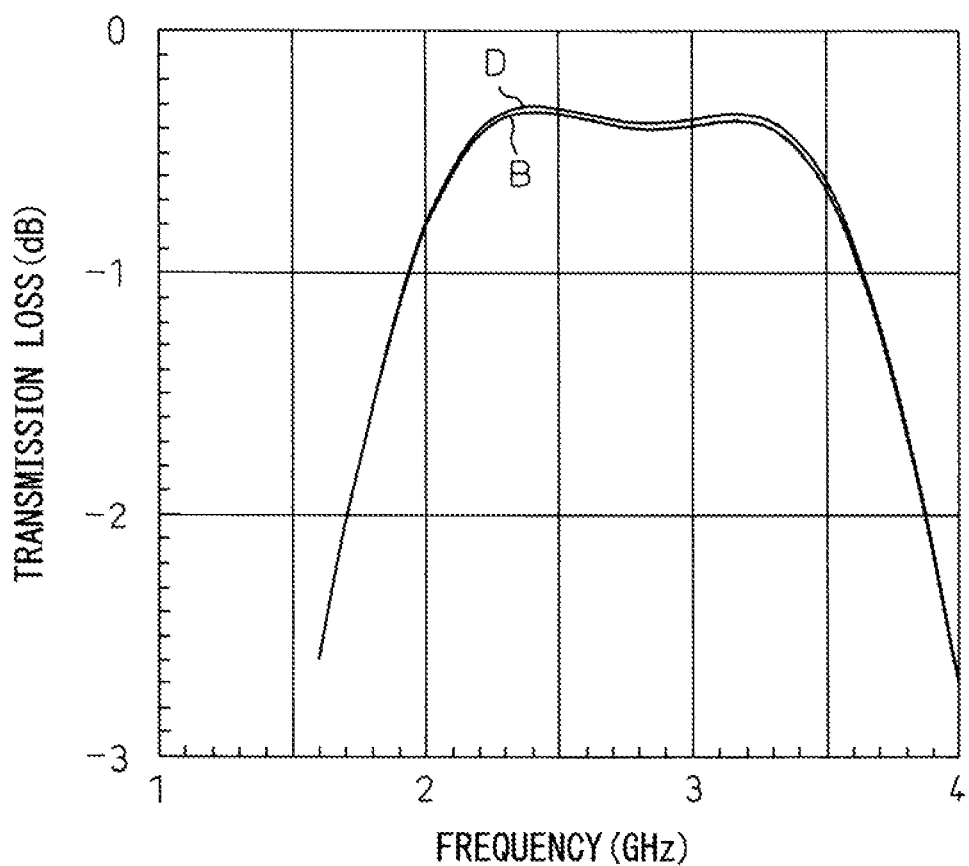
FIG. 13 is a graph of a calculation result of a calculation of the transmission loss in the output matching circuit in the fourth embodiment by a simulation.

FIG. 13 illustrates a calculation result D by calculating the transmission loss in the output matching circuit 30 in the fourth embodiment by a simulation and also illustrates the result in the second embodiment as B for information. From this result, it is possible to confirm that the loss may be reduced about 0.02 to 0.03 dB in the frequency range of 2.5 to 3.5 GHz by providing the electrode 56.

FIGS. 14A to 14C are diagrams illustrating the part of the ¼ wavelength line 34 and the two bent branch lines of the ¼ wavelength line 52 in an integrated circuit mounted device in a fifth embodiment, wherein FIG. 14A is a top view and FIG. 14B is a section view along the center line. FIG. 14C is a diagram schematically illustrating an impedance conversion circuit of the ¼ wavelength line 34 and the ¼ wavelength line 52 in the fifth embodiment.

In the integrated circuit mounted device in the fifth embodiment, the ¼ wavelength line in the second stage is formed by transmission lines formed on three substrates. The substrate 51 in the first embodiment in FIG. 3B is divided into two substrates 51A and 51B, and thereby, the two bent branch lines of the ¼ wavelength line 52 are also divided into two valves and branch lines 52A and 52B. A linear ¼ wavelength line 72 is formed on a substrate 71 of a material having a relative dielectric constant greater than that of the substrate 51. It is desirable for the thickness of the substrate 71 to be the same as the thickness of the substrates 51A and 51B. After these conditions are met, the material and shape of the substrate are determined so that the two bent branch lines 52A and 52B and the ¼ wavelength line 72 both become ¼ wavelength lines.

As illustrated in FIG. 14A, on both sides of the substrate 71, the two substrates 51A and 51B are arranged and by three sets of the bonding wires 53A, 53B, and a wire bonding 53C, the ¼ wavelength line 34 and the two bent branch lines 52A and 52B and the ¼ wavelength line 72 are connected, respectively. The other ends of the two bent branch lines 52A and 52B and the ¼ wavelength line 72 are connected commonly to the terminal of the package of the integrated circuit mounted device by bonding wires etc.

For example, the substrate 33 is set to have a substrate thickness of 0.25 mm and a relative dielectric constant of 140 and the ¼ wavelength line 34 is set to have a wire width of 1.5 mm and an Au wire thickness of 5 μm. The substrates 51A and 51B are set to have a substrate thickness of 0.38 mm and a relative dielectric constant of 9.8 and the ¼ wavelength lines 52A and 52B are set to have a wire width of 0.18 mm and an Au wire thickness of 5 μm. Further, the substrate 71 is set to have a substrate thickness of 0.5 mm and a relative dielectric constant of 30 and the liner ¼ wavelength line 72 is set to have a wire width of 0.04 mm, an Au wire thickness of 5 μm, and a wire length of 2.1 mm. Due to this, it is possible to form a matching circuit with a low loss without using a complicated substrate wire manufacturing process.

As illustrated in FIG. 14C, in the fifth embodiment, the second stage of the impedance conversion circuit is formed by three parallel transmission lines, and therefore, it is possible to cause a larger current to flow with a low loss.

When forming a ¼ wavelength line for one stage by using three or more lines as a parallel transmission line, the outer transmission lines and the line sandwiched thereby are formed on different dielectric substrates having different dielectric constants and the dielectric constant of the substrate on which the inner transmission line is formed is made greater than the dielectric constant of the substrate on which the outer lines are formed. Due to this, it is possible to realize parallel transmission lines having the same characteristic impedance and the same electrical length without using complicated manufacturing processes, such as wire crossing and multiple wiring. Due to this, it is possible to configure a matching circuit with a low loss and as a result, it is possible to realize a higher-performance, higher-output circuit.

The first to fifth embodiments are described as above and it is possible for persons skilled in the art to easily understand that for the configuration of the two bent branch lines of the ¼ wavelength line 52, there may be various modified examples. Several modified example are illustrated below, however, there may also be more modified examples.

Figure 15A:
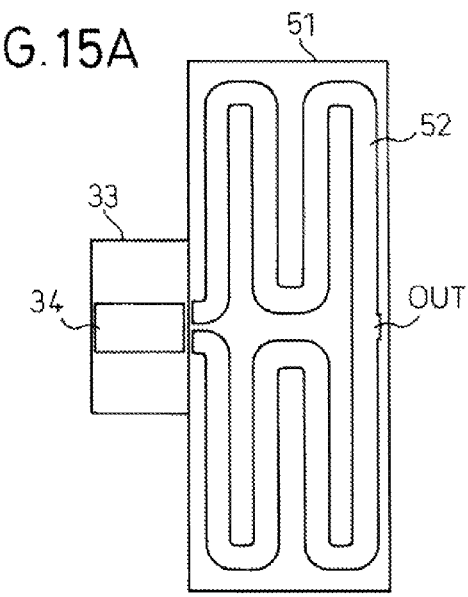
FIGS. 15A to 15D are diagrams illustrating a modified example of an output matching circuit.

FIG. 15A illustrates the two bent branch lines of the ¼ wavelength line 52 formed into a meander shape. In the first to fifth embodiments, the bent branch line is bent only once, however, it is also possible to bend the branch line three times or more to form a meandering shape as illustrated in FIG. 15A.

Figure 15B:
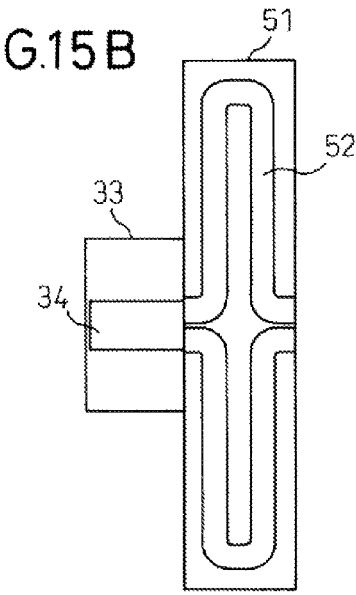

FIG. 15B illustrates a shape formed by bending the second end part on the opposite side of the first end part of the two bent branch lines of the ¼ wavelength line 52 to be connected to the ¼ wavelength line 34 in the same manner as that of the first end part. In the first to fifth embodiments, the second end part has a shape in which two end parts intersect rectilinearly and are integrated into one unit, however, the shape of the first end part as illustrated in FIG. 15B may be accepted. In this case, the second end parts of the two bent branch lines are connected commonly to the terminal of the package of the integrated circuit mounted device.

Figure 15C:
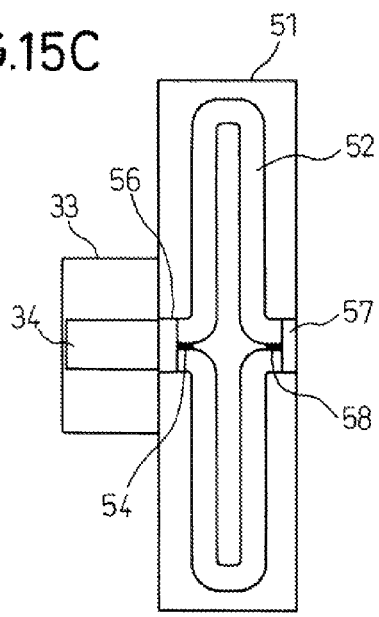

FIG. 15C illustrates an modified example of that in FIG. 15B, in which the electrode 56 and an electrode 57 are provided on both the first end part and the second end part as in the fourth embodiment and further, the resistor 54 and a resistor 58 are provided. The resistor 58 acts so as to dissolve the imbalance caused in the two bent branch lines.

Figure 15D:
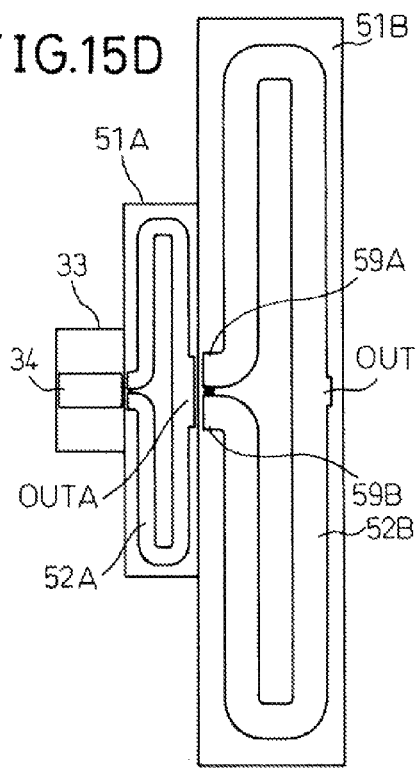

FIG. 15D illustrates an impedance transformer that performs impedance conversion using ¼ wavelength lines in three stages. In the first to fifth embodiments, the impedance transformer is formed by the ¼ wavelength lines in two stages, however, it is also possible to form an impedance transformer by ¼ wavelength lines in three or more stages. In a modified example in FIG. 15D, the ¼ wavelength lines in the second stage and the third stage are used as the transmission lines 52A and 52B in a bent shape. The relative dielectric constant of the substrate 51A on which the ¼ wavelength line 52A in the second stage is formed is lower than the relative dielectric constant of the substrate 32 on which the ¼ wavelength line 33 in the first stage is formed and higher than the relative dielectric constant of the substrate 51B on which the ¼ wavelength line 52B in the third stage is formed. Consequently, the path length of the ¼ wavelength line 52A is longer than the path length of the ¼ wavelength line 52B.

As described above, in the second to fifth embodiments and the modified examples in FIGS. 15A to 15D, the output matching circuit 30 is explained as an example, however, the same configuration may also be applied to the input matching circuit 20.

Figure 16A:
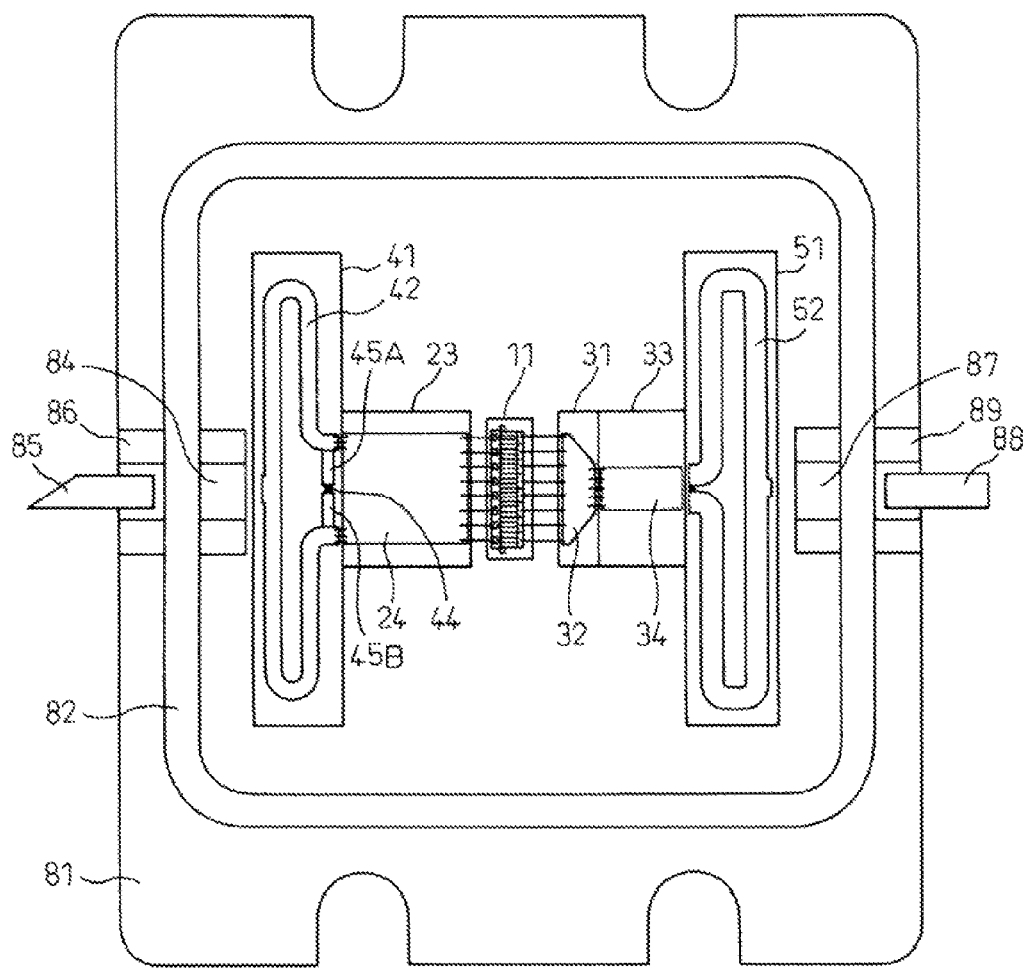
FIGS. 16A and 16B are diagrams illustrating a high-output amplifier circuit device that mounts the integrated circuit mounted device in the second embodiment in a hermetically sealed metal package having a metal wall.
Figure 16B:
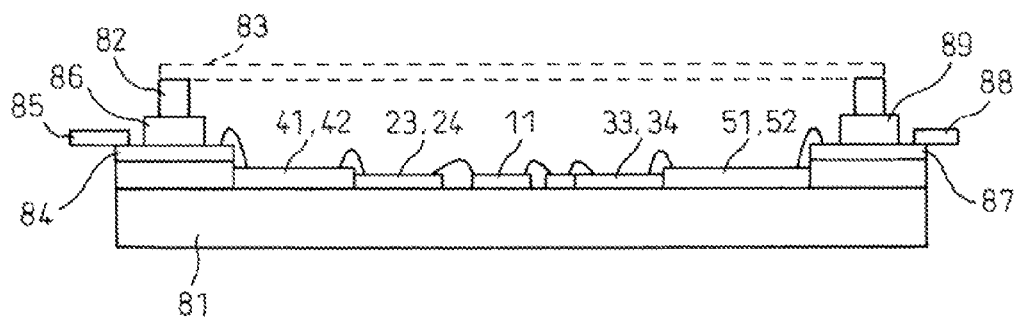

FIGS. 16A and 16B are diagrams illustrating a high-output amplifier circuit device that mounts the integrated circuit mounted device in the second embodiment in a hermetically sealed metal package having a metal wall.

The integrated circuit mounted device mounted inside is that in the second embodiment, however, the extension patterns 45A and 45B are provided in order to connect the two bent branch lines of the ¼ wavelength line 42 of the input matching circuit 20 on the side of the ¼ wavelength line 24 via a resistor 44.

The package is hermetically sealed by a metal wall 82 and a lid 83. For electrical connection with outside, connection electrodes 84 and 87 are provided. The connection electrodes 84 and 87 are electrically insulated from the metal wall 82 and the lid 83 by feed-throughs 86 and 89. At a part outside the package of the connection electrode 84, an input lead 85 is provided and at a part outside the connection electrode 87, an output lead 88 is provided. A part inside the package of the connection electrode 84 and the input part IN of the input matching circuit 20 are connected by a wire bonding, etc. A part inside the package of the connection electrode 88 and the output part OUT of the output matching circuit 30 are connected by a wire bonding etc.

The integrated circuit chip 11 mounts a plurality of GaN HEMTs having a gate length of 0.8 µm. As described above, the output matching circuit 30 uses the line 32 on the alumina ceramics substrate 31 having a thickness of 0.38 mm and a relative dielectric constant of 9.8, one ¼ wavelength line 34 on the high-k dielectric substrate 33 having a relative dielectric constant of 140, and the two parallel ¼ wavelength lines 52 on the alumina ceramics substrate 51 having a thickness of 0.38 mm and a relative dielectric constant of 9.8 immediately near the integrated circuit chip 11. Due to this, it is possible to reduce the length in the transverse direction in the figure and to store the high-output circuit in the package. The metal wire that connects the integrated circuit chip 11 and the line 32 on the substrate 31 and the line 32 on the substrate 31 function as an inductor and plays a roll to cancel the capacitive component of the output impedance of the transistor to achieve the impedance of a pure resistor on the end surface of the line 32 on the substrate 31. Due to this, the matching to 50Ω using the ¼ wavelength line is enabled. The package size is 17.4×24 mm and the circuit width may be set to 11.6 mm as illustrated in FIG. 3A. As illustrated in FIG. 2, the circuit width of the impedance transformer in the conventional example is 21.8 mm and the circuit width may be reduced to ½. The package size is specified by the industry and when the impedance transformer exceeds this size, matching is performed by manufacturing an impedance transformer on the printed substrate etc. outside the package, however, in this case, the circuit becomes larger. In contrast to this, in the described embodiment, ohmic matching may be performed in the package and downsizing of the device is made possible. Further, the transmission loss of the high-frequency current is reduced and a higher-performance, high-output circuit may be realized.

Figure 17:
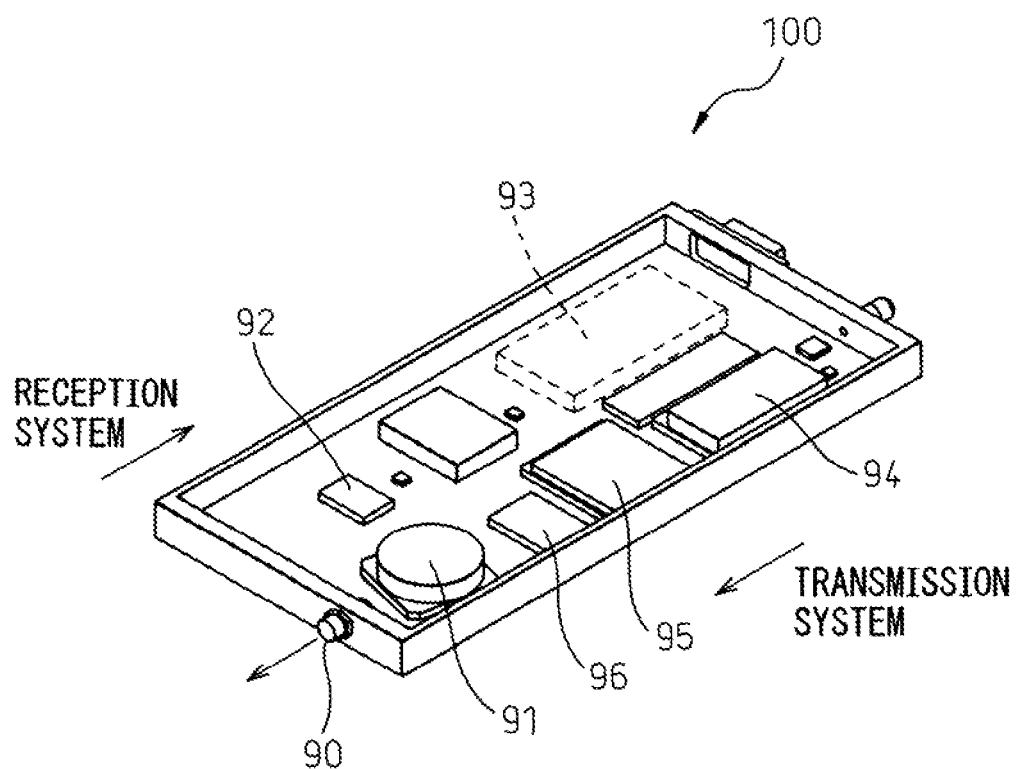
FIG. 17 is a diagram illustrating a configuration of a communication device module that uses a high-output amplifier circuit device.

FIG. 17 is a diagram illustrating a configuration of a communication device module 100 that uses the high-output amplifier circuit device in FIGS. 16A and 16B.

As illustrated in FIG. 17, the communication device module 100 includes an input/output terminal to be connected to an antenna, a transmission/reception switching device 91 connected to the input/output terminal 90, a low-noise amplifier 92, a control circuit 93, a previous-stage amplifier 94, a high-output amplifier 95, and a filter 96.

The row on the front-right side in FIG. 17 configures a transmission system and the rear-left side configures a reception system. An input signal from the input/output terminal 90 is selectively sent to the low-noise amplifier 92 by the transmission/reception switching device 91 and reception processing is performed. On the other hand, a transmission signal amplified in the previous-stage amplifier 94 is further amplified by the high-output amplifier 95 and selectively sent to the input/output terminal 90 by the transmission/reception switching device 91 through the filter 96 and transmitted from the antenna. As the high-output amplifier 95, the high-output amplifier circuit device in FIGS. 16A and 16B is used. Nevertheless the high-output amplifier circuit device in FIGS. 16A and 16B may be used in the transmission communication device module not in the transmission/reception communication device module.

The communication device module 100 in FIG. 7 is used as part of a system device, such as a communication system, radar, sensor, and radio interference unit. When mounted in various kinds of system device, the high-performance, compact high-output amplifier circuit device in FIGS. 16A and 16B may contribute to the improvement of performance and downsizing of a device.

Each embodiment is explained as above, however, it is possible for persons skilled in the art to easily understand that there may also be various modified examples and applications.

For example, in the above-mentioned embodiment, the impedance transformer is a ¼ wavelength line, however, the constitutions of the embodiments may also be applied to an impedance transformer configured by a serial inductor and parallel capacitors and the same effect may be obtained. The inductor may be configured by a spiral inductor or a meander line. The capacitor may be configured by packaging a chip capacitor on a package base with AuSn solder and by connecting its upper electrode and the transmission line by a wire. Alternatively, by forming a pattern beside the transmission line and connecting its pattern and the transmission line by a wire, it is possible to make have a function as a capacitor. By the changes described above, it is possible to configure a circuit as a lumped parameter element, and therefore, the circuit may be downsized.

It may also be possible to configure a transmission line the characteristic impedance of which is reduced by connecting the ¼ wavelength line and a dummy pattern beside the line by a wire to add a ground capacitance. Due to this, it is possible to adjust the characteristic impedance and to absorb the variation in transistor and packaging, and thus, the yields of the circuit are improved.

Further, in the above-mentioned embodiment, the micro strip line is used, however, another transmission line, such as a coplanar line and a strip line, may also be used. Further, in the above-mentioned embodiment, the GaN transistor is used, however, it may also be possible to use an integrated circuit including a transistor using Si, GaAs, or InP. In the above-mentioned embodiment, the circuit is formed by the integrated circuit including the transistor and the matching circuit substrate, however, it may also be possible to form a hybrid IC that uses a chip that is an MMIC, in which a resistor, capacitor, and matching circuit are integrated partially in the chip, and in which a matching circuit substrate is configured outside thereof. Further, it may also be possible to form an MMIC, in which a resistor, capacitor, and matching circuit are integrated. In the embodiment described above, the chip and the matching circuit substrate are packaged using AuSn solder, however, they may be packaged using an electrically conductive adhesive. In this case, packaging may be performed at a temperature of 200° C. or less, and therefore, it is possible to suppress cracks resulting from the difference in the thermal expansion coefficient among the package, chip, matching circuit substrate, and capacitor, and therefore, yields may be improved. Furthermore, it is possible to perform packaging without deteriorating the device characteristics of an InP etc. the heat resistance of which is comparably poor. It is also possible to apply a material (copper) excellent in heat dissipating properties and having a large difference in the thermal expansion coefficient of the packaging materials, and therefore, a higher-output circuit may be realized. In the embodiment described above, the TaN thin film resistor is used, however, it may also be possible to use NiCr.

As explained above, according to the embodiments, the loss of the matching circuit configuring a high-output semiconductor circuit and the circuit area are reduced, and therefore, a higher-performance, high-output semiconductor circuit ire realized.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. An impedance transformer comprising a first transmission line and a second transmission line, the first and second transmission lines comprising quarter wavelength lines and having different characteristic impedances, wherein the first transmission line consists of a linear line and the second transmission line comprises a plurality of branch lines that respectively include a first end part and a second end part and have substantially the same line length, wherein
   each branch line of the plurality of branch lines has a bent shape,
   the first end parts of the plurality of branch lines are commonly connected to the first transmission line, and
   the second end parts of the plurality of branch lines are configured for connection to a common terminal
   the impedance transformer further comprising a plurality of bonding wires that connect the first end parts of the plurality of branch lines and the first transmission line, wherein
   the plurality of bonding wires include bonding wires that come into contact with the vicinity of the end part of the first transmission line.

2. The impedance transformer according to claim 1, wherein
   the second transmission line further comprises one linear micro strip line formed on a first substrate having a first dielectric constant; and
   the plurality of branch lines comprises two micro strip lines that are respectively formed on two substrates having a second dielectric constant lower than the first dielectric constant and have bent shapes in symmetry with each other with respect to a straight line;
   the two micro strip lines being arranged respectively on either side of the linear micro strip line.

3. The impedance transformer according to claim 1, wherein
   the plurality of branch lines comprises two micro strip lines that are formed on substrates having the same dielectric constant and have bent shapes in symmetry with each other with respect to a straight line.

4. The impedance transformer according to claim 3, wherein
   the two micro strip lines comprise a common electrode to which the first end parts are connected commonly.

5. The impedance transformer according to claim 3, wherein
   the second end parts of the two micro strip lines are integrated into one unit.

6. The impedance transformer according to claim 3, wherein
   the two micro strip lines comprise a resistor that connects the two micro strip lines in the vicinity of the first end part.

7. The impedance transformer according to claim 3, wherein
   the first end parts of the two micro strip lines are separated.

8. The impedance transformer according to claim 7, wherein
   the first end parts of the two micro strip lines are in a tapered shape.

9. An integrated circuit mounted device comprising an integrated circuit and a matching circuit, wherein
   the matching circuit comprises an impedance transformer that includes a first transmission line and a second transmission line, the first and second transmission lines comprising quarter wavelength lines and having different characteristic impedances, wherein the first transmission line consists of a linear line and the second transmission line comprises a plurality of branch lines that respectively include a first end part and a second end part and have substantially the same line length, wherein
   each branch line of the plurality of branch lines has a bent shape,
   the first end parts of the plurality of branch lines are commonly connected to the first transmission line, and
   the second end parts of the plurality of branch lines are configured for connection to a common terminal
   the impedance transformer further comprising a plurality of bonding wires that connect the first end parts of the plurality of branch lines and the first transmission line, wherein
   the plurality of bonding wires include bonding wires that come into contact with the vicinity of the end part of the first transmission line.

10. The integrated circuit mounted device according to claim 9, wherein
    the plurality of branch lines comprise two micro strip lines that are formed on substrates having the same dielectric constant and have bent shapes in symmetry with each other with respect to a straight line.

11. A communication device module comprising an integrated circuit mounted device including an integrated circuit and a matching circuit, wherein
    the matching circuit comprises an impedance transformer that includes a first transmission line and a second transmission line, the first and second transmission lines comprising quarter wavelength lines and having different characteristic impedances, wherein the first transmission line consists of a linear line and the second transmission line comprises a plurality of branch lines that respectively include a first end part and a second end part and have substantially the same line length, wherein
each branch line of the plurality of branch lines has a bent shape,
the first end parts of the plurality of branch lines are commonly connected to the first transmission line, and
the second end parts of the plurality of branch lines are configured for connection to a common terminal
the impedance transformer further comprising a plurality of bonding wires that connect the first end parts of the plurality of branch lines and the first transmission line, wherein
the plurality of bonding wires include bonding wires that come into contact with the vicinity of the end part of the first transmission line.

* * * * *